(12) United States Patent
Law et al.

(10) Patent No.: US 8,552,563 B2
(45) Date of Patent: Oct. 8, 2013

(54) THREE-DIMENSIONAL SEMICONDUCTOR ARCHITECTURE

(75) Inventors: Oscar M. K. Law, Hsin-Chu (TW); Kuo H. Wu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 232 days.

(21) Appl. No.: 12/652,900

(22) Filed: Jan. 6, 2010

(65) Prior Publication Data

US 2010/0252934 A1    Oct. 7, 2010

Related U.S. Application Data

(60) Provisional application No. 61/167,233, filed on Apr. 7, 2009.

(51) Int. Cl.
*H01L 23/535* (2006.01)

(52) U.S. Cl.
USPC ............ 257/774; 257/776; 257/E23.067

(58) Field of Classification Search
USPC ............ 257/774, 776, E23.067; 438/280
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,285,560 B1 * | 9/2001 | Lyne | 361/760 |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,495,454 B2 * | 12/2002 | Livengood et al. | 438/667 |
| 6,528,882 B2 * | 3/2003 | Ding et al. | 257/738 |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |

(Continued)

FOREIGN PATENT DOCUMENTS

| | | |
|---|---|---|
| TW | 200820412 | 5/2008 |
| TW | 200841452 | 10/2008 |

(Continued)

*Primary Examiner* — Allan R Wilson
(74) *Attorney, Agent, or Firm* — Slater & Matsil, L.L.P.

(57) ABSTRACT

A system and method for making semiconductor die connections with through-silicon vias (TSVs) are disclosed. TSVs are formed through the substrate to allow for signal connections as well as power and ground connections. In one embodiment this allows these connections to be made throughout the substrate instead of on the periphery of the substrate. In another embodiment, the TSVs are used as part of a power matrix to supply power and ground connections to the active devices and metallization layers through the substrate.

19 Claims, 10 Drawing Sheets

(56) References Cited

U.S. PATENT DOCUMENTS

| | | | |
|---|---|---|---|
| 7,034,401 B2* | 4/2006 | Savastiouk et al. | 257/778 |
| 7,049,170 B2 | 5/2006 | Savastiouk et al. | |
| 7,060,601 B2 | 6/2006 | Savastiouk et al. | |
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,825,024 B2* | 11/2010 | Lin et al. | 438/637 |
| 7,998,860 B2* | 8/2011 | Li et al. | 438/667 |
| 8,067,814 B2* | 11/2011 | Takehara et al. | 257/528 |
| 8,093,711 B2* | 1/2012 | Zudock et al. | 257/698 |
| 8,106,504 B2* | 1/2012 | Yang | 257/692 |
| 8,264,067 B2* | 9/2012 | Law et al. | 257/621 |
| 8,344,496 B1* | 1/2013 | White et al. | 257/691 |
| 2002/0020862 A1* | 2/2002 | Livengood et al. | 257/276 |
| 2002/0153616 A1* | 10/2002 | Kunihisa et al. | 257/778 |
| 2003/0001280 A1* | 1/2003 | Noguchi et al. | 257/774 |
| 2003/0111733 A1* | 6/2003 | Pogge et al. | 257/774 |
| 2003/0209807 A1* | 11/2003 | Hosomi | 257/774 |
| 2004/0166659 A1* | 8/2004 | Lin et al. | 438/611 |
| 2008/0169120 A1* | 7/2008 | Inagaki et al. | 174/255 |
| 2009/0085217 A1* | 4/2009 | Knickerbocker et al. | 257/774 |
| 2010/0072588 A1* | 3/2010 | Yang | 257/676 |
| 2010/0148336 A1* | 6/2010 | Do et al. | 257/686 |
| 2010/0171226 A1* | 7/2010 | West et al. | 257/774 |
| 2011/0001249 A1* | 1/2011 | Law et al. | 257/776 |

FOREIGN PATENT DOCUMENTS

| | | |
|---|---|---|
| TW | 200843061 | 11/2008 |
| TW | 200901343 | 1/2009 |
| TW | 200905764 | 2/2009 |
| TW | 200905851 | 2/2009 |
| TW | 200908311 | 2/2009 |
| TW | 200915451 | 4/2009 |

* cited by examiner

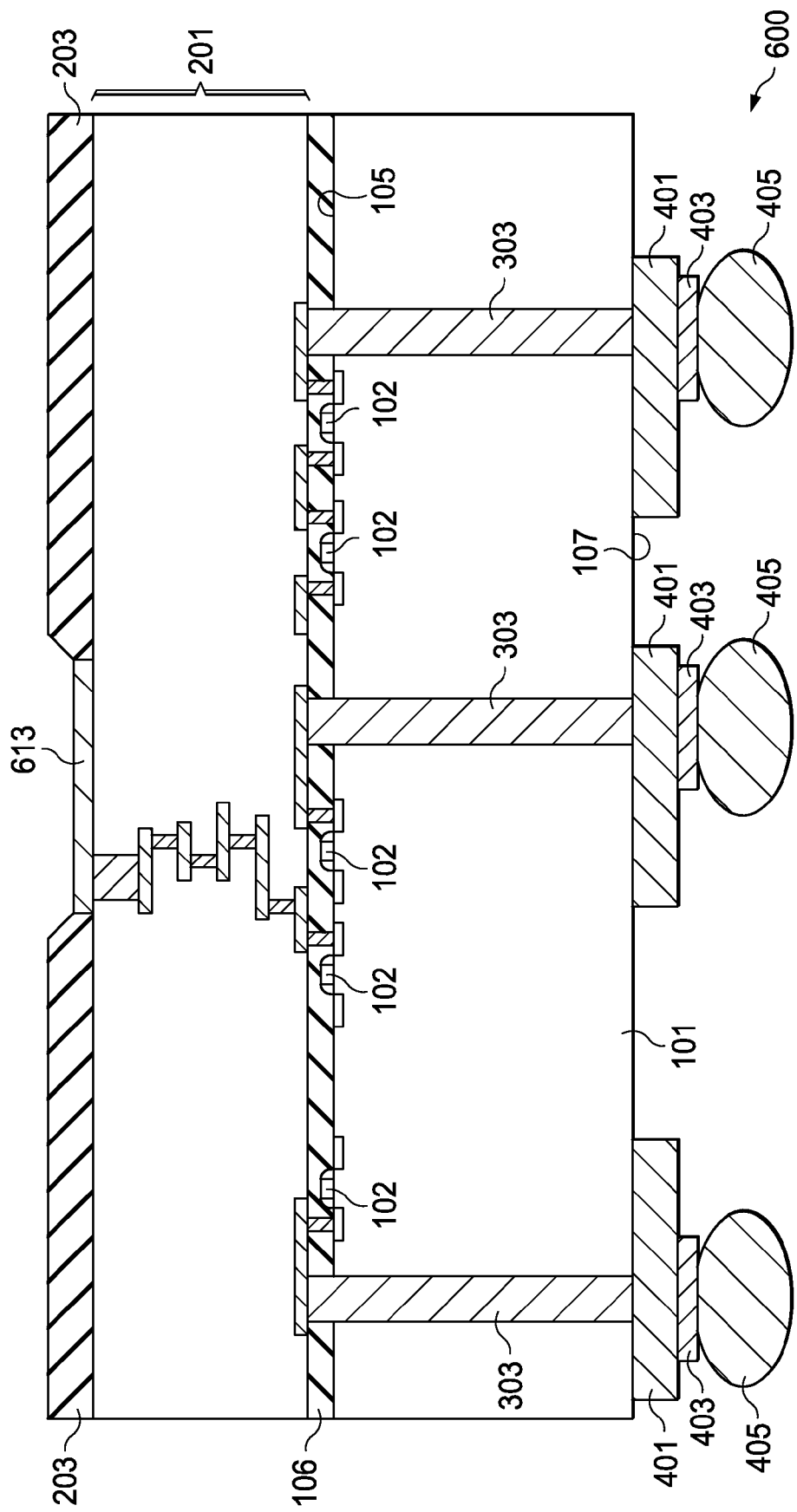

THREE-DIMENSIONAL SEMICONDUCTOR ARCHITECTURE

This application claims the benefit of U.S. Provisional Patent Application Ser. No. 61/167,233, filed on Apr. 7, 2009, and entitled "Three-Dimensional Semiconductor Architecture," which application is incorporated herein by reference.

TECHNICAL FIELD

The present invention relates generally to a system and method for connecting semiconductor devices and, more particularly, to a system and method for providing connections to a back side of a semiconductor die.

BACKGROUND

Generally, contact pads are used by semiconductor devices to provide for signal, power, and ground connectivity to exterior devices. Within the semiconductor devices the contact pads are generally connected to metallization layers located over the active devices. The metallization layers route the signal, power, and ground connections to their desired location, and also interconnect the various active devices in order to form functional circuitry.

However, due to routing congestion from the sheer number of contact pads, these contact pads are typically bunched together along the outside periphery of the device, which works to limit any reduction in the size of the overall device. Further, as semiconductor devices have grown more powerful and more complicated, the internal routing interconnects within the metallization layers have also become more complicated. This has resulted in an increase in the number of metallization layers, as well as an increase in resistivity and power consumption due to the extra layers high resistive vias that are required. These complications have also led to the two upper most metallization layers to typically be almost completely dedicated to routing the power and ground in what is referred to as a power mesh of metallization layers.

By requiring the signal, power, and ground connections to all be made through the contact pads over the metallization layer, the complexity and distance of the routing required for the power, ground, and signal interconnects is increased, leading to larger resistivities, larger power consumption, greater number of metallization layers, and larger overall production costs. As such, what is needed is a method to reduce the complexity of the signal, power, and ground interconnections through the metallization layers.

SUMMARY OF THE INVENTION

These and other problems are generally solved or circumvented, and technical advantages are generally achieved, by embodiments of the present invention which provide for through-silicon via (TSV) connections through a substrate.

In accordance with an embodiment of the present invention, a semiconductor device comprises a substrate with a first side and a second side opposite the first side, the substrate on the second side having a peripheral region and an interior region surrounded by the peripheral region. A plurality of active devices is located on the first side of the substrate and a first set of conductive vias extend through the substrate in the peripheral region. A second set of conductive vias extends through the substrate in the interior region.

In accordance with another embodiment of the present invention, a semiconductor device comprises a first substrate with a first side and second side, and active devices and a metallization region are located on the first side of the substrate. A power matrix is located on the second side of the substrate.

In accordance with yet another embodiment of the present invention, a method of manufacturing a semiconductor device comprises providing a substrate with a first side and a second side, the second side having a peripheral region and an interior region surrounded by the peripheral region. A first set of conductive vias are formed in the peripheral region, the first set of conductive vias extending from the second side to the first side. A second set of conductive vias are formed in the interior region, the second set of conductive vias extending from the second side to the first side.

An advantage of embodiments of the present invention is that the number of metallization layers may be reduced, thereby leading to smaller overall devices. Additionally, overall size limitations may be reduced as signal and power connections may be relocated from the periphery of the device and placed into the interior of the substrate.

BRIEF DESCRIPTION OF THE DRAWINGS

For a more complete understanding of the present invention, and the advantages thereof, reference is now made to the following descriptions taken in conjunction with the accompanying drawings, in which:

FIGS. 6a-6d illustrate a cross-sectional view and a plan view of a power matrix in accordance with an embodiment of the present invention.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments of the present invention are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments of the present invention in a specific context, namely a semiconductor die with I/O connections routed to the back side of the semiconductor die in a system-on-chip configuration. However, the present invention may also be used with other types of connections through a semiconductor die.

Figure 1:
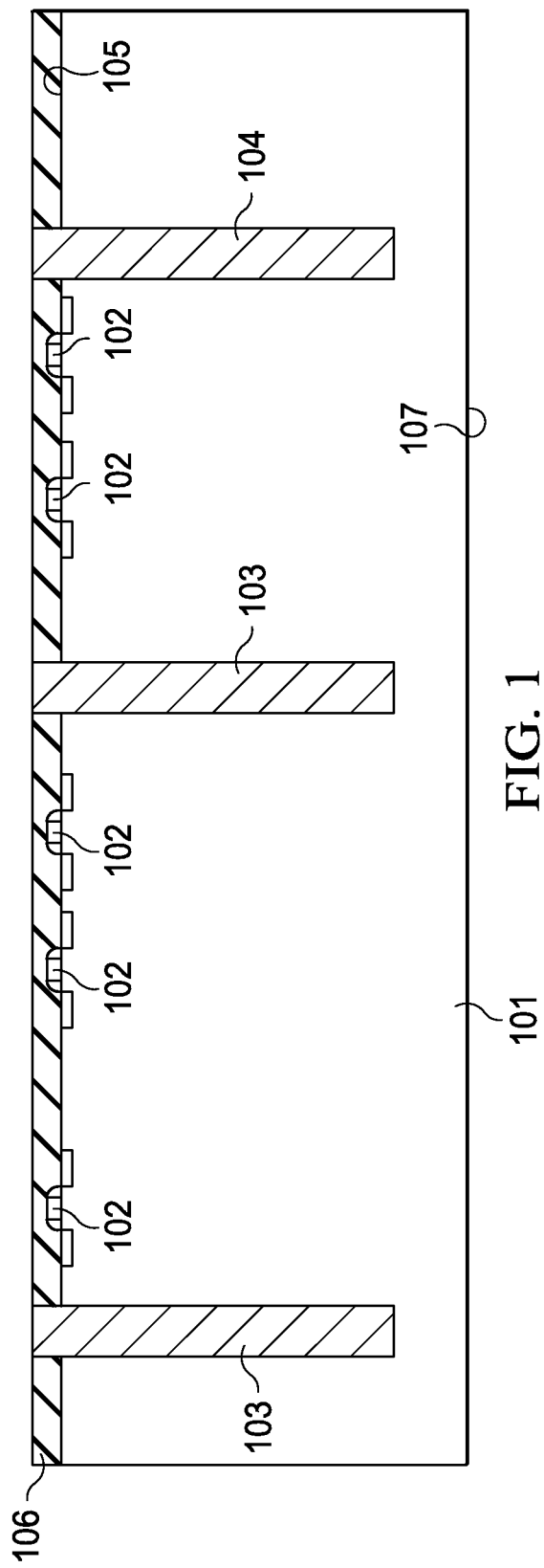
FIGS. 1-4 illustrate steps in the formation of through-silicon vias in accordance with an embodiment of the present invention.

With reference now to FIG. 1, there is shown a substrate 101 with active devices 102 and an interlayer dielectric (ILD) 106, the substrate having a first side 105 and a second side 107 opposite the first side 105. Additionally, signal vias 103 and power/ground (P/G) vias 104 are formed within the substrate 101 and the ILD 106. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices 102 are represented on FIG. 1 as five transistors. However, as one of skill in the art will recognize, a wide variety of active devices 102 such as capacitors, resistors, high-k metal gate devices, inductors and the like may be used to generate the desired structural and functional requirements of the design. Additionally, the active devices 102 may be integrated to form a variety of circuits, such as signal drivers, signal receivers, electrostatic discharge structures, or the like. The active devices 102 may be formed using any suitable methods either within or else on the surface of the substrate 101.

The ILD 106 is formed over the substrate 101 and active devices 102 by chemical vapor deposition, sputtering, or any other method suitable for forming an ILD 106. The ILD 106 typically has a planarized surface and may be comprised of silicon oxide, although other materials, such as high-k materials, could alternatively be utilized. Optionally, the ILD 106 may be formed so as to impart a strain to the substrate 101 within the active devices 102, which will increase the overall performance of the active devices 102, as is known in the art.

The signal vias 103 and the P/G via 104 may be formed by initially applying and developing a suitable photoresist (not shown), and then etching the ILD 106 and substrate 101 to form openings. The openings at this stage are formed so as to extend into the substrate 101 at least further than the active devices 102, and to a depth at least greater than the eventual desired height of the finished substrate 101. Accordingly, while the depth is dependent upon the overall design of the substrate 101, the depth may be between about 1 μm and about 700 μm below the surface of the substrate 101, such as about 50 μm. The openings also may be formed to have a diameter of between about 1 μm and about 100 μm, such as about 6 μm.

Once the openings have been formed, the openings may be filled with a barrier layer (not shown) and a conductive material to form the signal vias 103 and the P/G via 104. The barrier layer may comprise a conductive material such as titanium nitride, although other materials, such as tantalum nitride, titanium, a dielectric, or the like may alternatively be utilized. The barrier layer may be formed using a CVD process, such as PECVD. However, other alternative processes, such as sputtering or metal organic chemical vapor deposition (MOCVD), may alternatively be used. The barrier layer is formed so as to contour to the underlying shape of the openings for the signal vias 103 and the P/G via 104.

The conductive material may comprise copper, although other suitable materials such as aluminum, alloys, doped polysilicon, combinations thereof, and the like, may alternatively be utilized. The conductive material may be formed by depositing a seed layer and then electroplating copper onto the seed layer, filling and overfilling the openings for the signal vias 103 and the P/G via 104. Once the openings for the signal vias 103 and the P/G via 104 have been filled, excess barrier layer and excess conductive material outside of the openings for the signal vias 103 and the P/G via 104 are removed through a grinding process such as chemical mechanical polishing (CMP), although any suitable removal process may be used.

Figure 2:
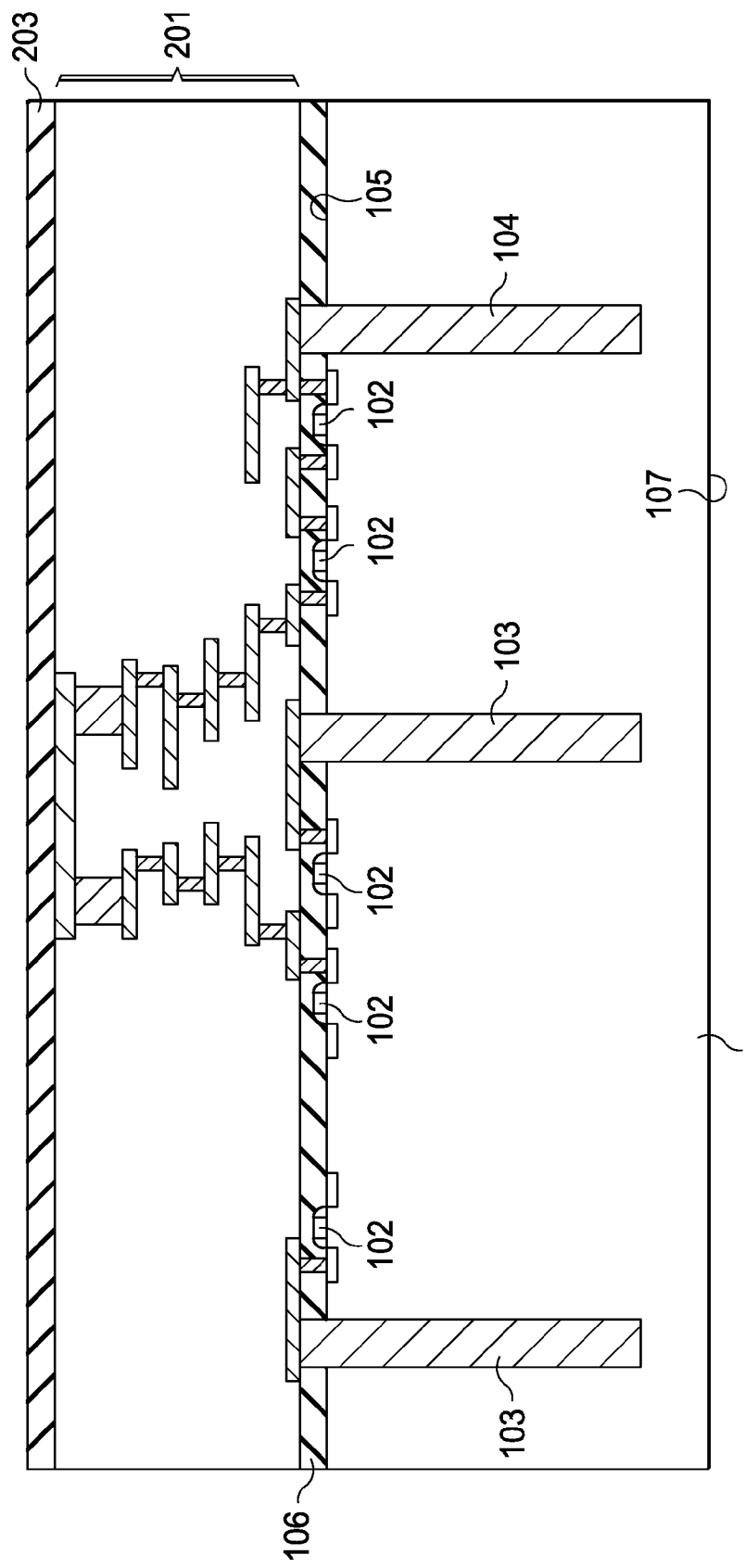

FIG. 2 illustrates the formation of metallization layers 201 and a passivation layer 203 over the ILD 106, the substrate 101, and the signal vias 103 and the P/G via 104. In this embodiment the metallization layers 201 include interconnections and connective lines to route signals between various active devices 102 over the first side 105 of the substrate 101. However, in this embodiment, the inputs, outputs, power and ground are routed to the signal vias 103 and the P/G via 104, which will form through-silicon vias (TSVs) as described below with respect to FIG. 3, and there is no need for I/O contact pads and their associated routing over the first side 105 of the substrate 101. As such, as more space is available for signal routing between active devices 102, fewer metallization layers (e.g., six metallization layers or less) may be utilized.

The metallization layers 201 are formed over the substrate 101, the active devices 102, the ILD 106, the signal vias 103 and the P/G via 104, and are designed to connect the various active devices 102 to form functional circuitry. The metallization layers 201 are formed of alternating layers of dielectric and conductive material and may be formed through any suitable process (such as deposition, damascene, dual damascene, etc.). In an embodiment, there are at least four metallization layers separated from the substrate 101 by the ILD 106, but the precise number of metallization layers 201 is dependent at least in part upon the overall design of the semiconductor die.

The passivation layer 203 in this embodiment may be formed as a complete, continuous layer so as to encapsulate the metallization layers 201 from exterior contacts. Further, as the I/O connections are routed through the substrate 101 by the signal vias 103 and the P/G via 104, the passivation layer 203 may be free from openings that would allow electrical contact to be made to the metallization layers 201. The passivation layer 203 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The passivation layer 203 may be formed through a process such as chemical vapor deposition (CVD), although any suitable process may be utilized.

Figure 3:
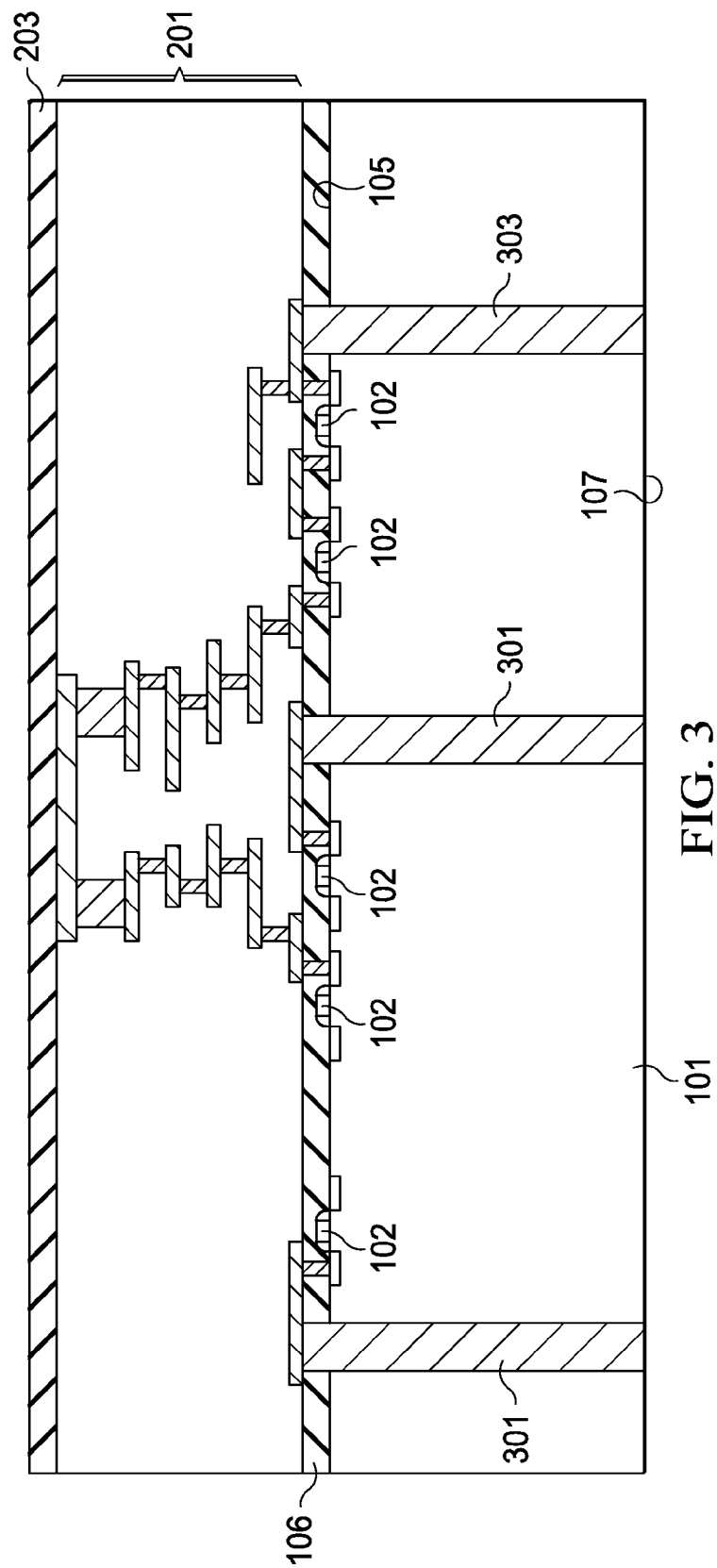

FIG. 3 illustrates a thinning of the substrate 101 in order to expose the signal vias 103 and the P/G via 104 to form signal TSVs 301 and a P/G TSV 303. To thin the substrate 101, portions of the second side 107 of the substrate 101 are removed to expose the conductive material located within the signal vias 103 and the P/G via 104 (see FIG. 2). The removal may be performed with a grinding process such as a CMP, although other suitable processes, such as etching, may alternatively be used.

However, as one of ordinary skill in the art will recognize, the above described methods of forming the signal TSVs 301 and the P/G TSV 303 are merely one illustrative embodiment, and are not intended to limit the present invention to just these methods. Other suitable methods may alternatively be utilized. For example, openings for the signal TSVs 301 and the P/G TSV 303 may be filled with dielectric material until after the thinning of the second side 107 of the substrate 101, at which point the dielectric material may be removed and replaced with conductive material. These embodiments, and any other suitable embodiment, may alternatively be used to form the signal TSVs 301 and the P/G TSVs 303.

After the removal of a portion of the second side 107 of the substrate 101, a cleaning etch may be performed. This cleaning etch is intended to clean and polish the substrate 101 after the CMP. Additionally, this cleaning etch also helps release stresses that may have formed during the CMP process of grinding the substrate 101. The cleaning etch may use $HNO_3$, although other suitable etchants may alternatively be used.

Figure 4:
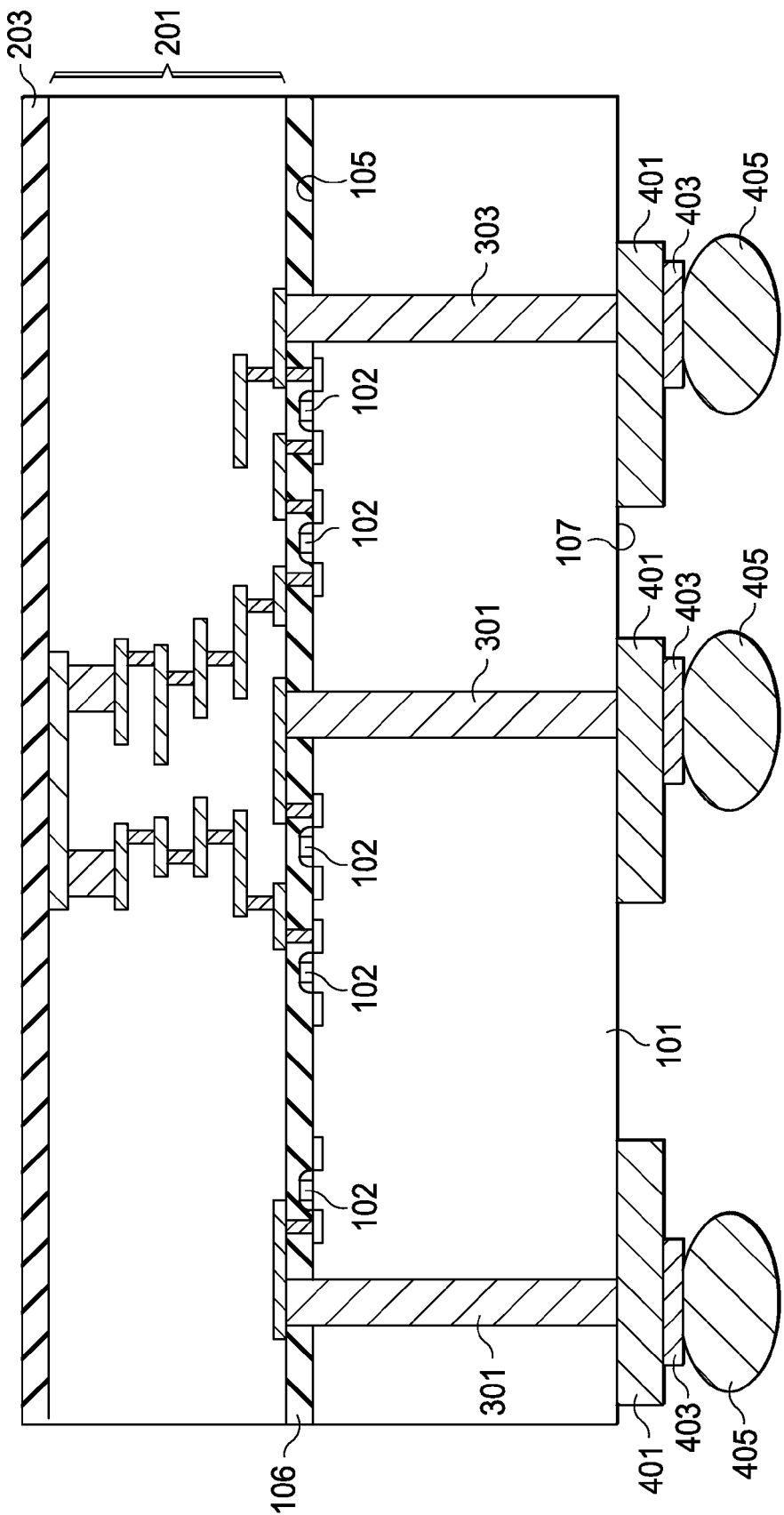

FIG. 4 illustrates the formation of redistribution lines 401 on the second side 107 of the substrate 101 in electrical connection with the signal TSVs 301 and the P/G TSV 303. The redistribution lines 401 extend from their respective TSVs to electrically connect the signal TSVs 301 and the P/G TSVs 303 to underbump metallizations (UBMs) 403 as described below.

The redistribution lines 401 may be formed using suitable methods for forming interconnect lines in integrated circuits. The redistribution lines 401 comprise at least one conductive layer formed of a metal such as aluminum, copper, tungsten, titanium, and combinations thereof. The redistribution lines 401 may be formed by plating the metal on a seed layer and then etching the undesired portions, leaving the redistribution lines 401. In an embodiment, the redistribution lines 401 are between about 2 µm and about 30 µm, such as about 5 µm. However, other materials and process, such as a well-known damascene process, could alternatively be used to form the redistribution lines 401.

As one of skill in the art will recognize, the redistribution lines 401 could be a single layer of conductive material or else could alternatively be multiple layers of conductive material, depending upon the properties desired. For example, the redistribution lines 401 as formed above may be plated with another conductive material such as gold or chromium to provide good adhesion for a subsequently formed connector. This plating could be done through a process such as CVD.

UBMs 403 may be formed adjacent to portions of the redistribution lines 401 in order to provide a beneficial interface for exterior connectors 405. Additionally, while the UBMs 403 are shown in FIG. 4 as being located opposite the redistribution lines 401 from the signal TSVs 301 and the P/G TSV 303 for clarity, one of ordinary skill in the art will recognize that the exact placement of the UBMs 403 will be determined at least in part upon the overall design while still remaining electrically connected to the signal TSVs 301 and the P/G TSV 303 through the redistribution lines 401.

The UBMs 403 may be made of at least three layers of conductive materials, such as a layer of chrome, a layer of a chrome-copper alloy, and a layer of copper, with an optional layer of gold over the top of the copper layer. However, one of skill in the art will recognize that there are many suitable arrangements of materials and layers, such as an arrangement of titanium/titanium tungsten/copper or an arrangement of copper/nickel/gold, that are suitable for the formation of the UBMs 403. Any suitable materials or layers of material that may be used for the UBMs 403 are fully intended to be included within the scope of the current application.

The UBMs 403 may be created by forming each layer conformally over the redistribution lines 401. The forming of each layer may be done using a CVD process, such as PECVD, although other processes of formation, such as sputtering or evaporation, may alternatively be used depending upon the desired materials. Each of the layers within the UBMs 403 may have a thickness of between about 10 µm and about 100 µm, such as about 45 µm. Once the desired layers have been formed, portions of the layers are then removed through a suitable photolithographic masking and etching process to remove the undesired material and to leave patterned UBMs 403.

The exterior connectors 405 may comprise contact bumps made of a material such as tin, or other suitable materials, such as silver, lead-free tin, or copper. In an embodiment in which the exterior connectors 405 are tin solder bumps, the exterior connectors 405 may be formed by initially forming a layer of tin through such commonly used methods such as evaporation, electroplating, printing, solder transfer, ball placement, etc., to a thickness of about 100 µm. Once a layer of tin has been formed on the structure, a reflow may be performed in order to shape the material into the desired bump shapes.

By using the signal TSVs 301 and the P/G TSV 303 to directly connect the circuitry to the second side 107 of the substrate 101, a shortened low resistive path is formed for external I/O interfaces. As such, the typical high resistive stacked vias and long metal routing that is typically associated with signal and power routing located over the first side 105 of the substrate 101 may be eliminated, allowing for a reduced number of metallization layers. Additionally, since there are no connections required through the passivation layer 203 in this embodiment, a narrower wire may be used for the top metal layers instead of the relatively thick wires that would normally be used in the uppermost layer of the metallization layers 201, allowing for an even further improvement in routability.

Figure 5A:
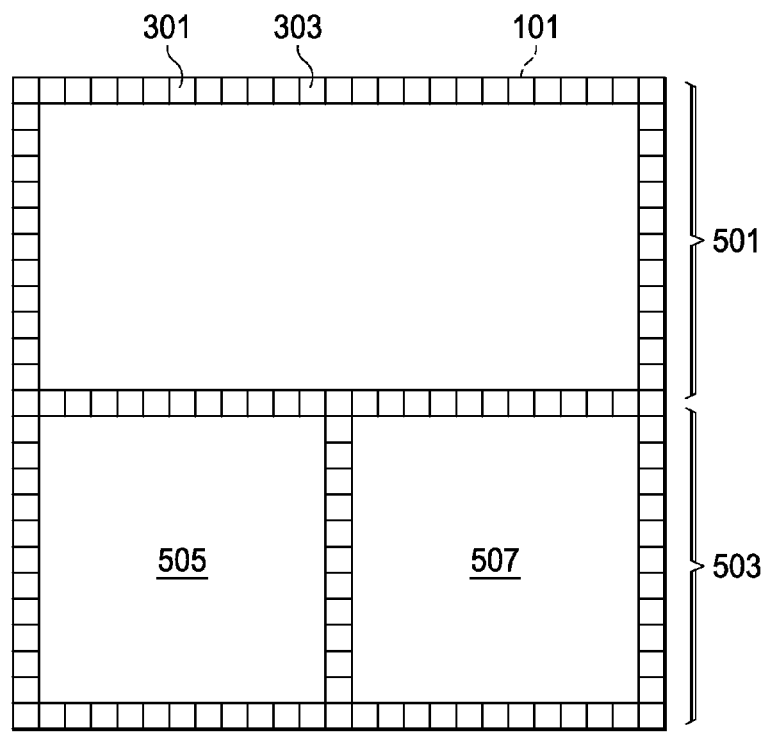
FIGS. 5a-5b illustrate through-silicon via (TSV) layouts in accordance with an embodiment of the present invention.

FIG. 5a illustrates one potential I/O layout architecture in accordance with an embodiment of the present invention. As illustrated in FIG. 4, the metallization layers 201 are directly connected to the redistribution lines 401 on the second side 107 of the substrate 101 through the signal TSVs 301 and the P/G TSV 303, thereby allowing the signal TSVs 301 and the P/G TSV 303 to be placed in any configuration on the second side 107 of the substrate 101 while still maintaining a shortened interconnect. For example, and as specifically illustrated in FIG. 5a, the signal TSVs 301 and the P/G TSV 303 may be placed in lines along not only the periphery of the second side 107 of the substrate 101, but also as extensions that may segment the substrate 101 into a first section 501 and a second section 503, or even further segment the second section into a third section 505 and a fourth section 507, or any combination thereof.

Figure 5B:
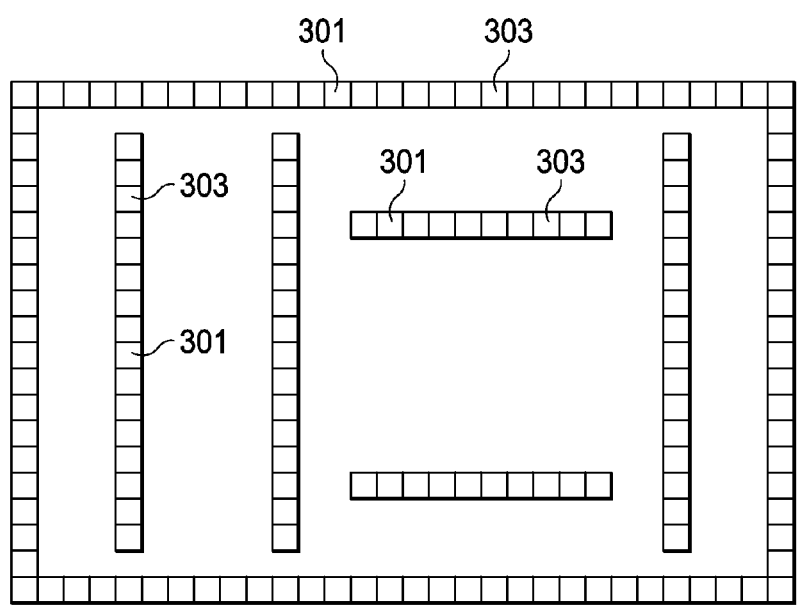

FIG. 5b illustrates another potential I/O layout architecture in accordance with another embodiment of the present invention. In this I/O layout architecture, signal TSVs 301 and the P/G TSVs 303 are formed into two separate groups: a periphery group and an interior group. In the periphery group the signal TSVs 301 and the P/G TSVs 303 are arranged along the outer edge of the substrate 101. The interior group of signal TSVs 301 and the P/G TSVs 303, surrounded by the periphery group of signal TSVs 301 and the P/G TSVs 303, are arranged into one or more separate, discrete lines. These separate and discrete lines may be formed parallel to any edge of the substrate 101, and multiple lines may be formed perpendicular to each other.

However, as one of ordinary skill in the art will recognize, the layout architecture embodiments illustrated above in FIGS. 5a and 5b are merely illustrations of two such embodiments, and are not meant to be limiting in any fashion. With the inclusion of the redistribution lines 401, any potential layout for the signal TSVs 301 and the P/G TSVs 303 may be realized while still maintaining connections to the exterior connectors 405. All of these potential layout architectures are fully intended to be included within the scope of the present invention.

Because the inclusion of the signal TSVs 301, the P/G TSV 303, and redistribution lines 401 increases the available options for routing power and signals, the overall number of metal layers over the active devices 102 may be decreased, resulting in smaller and cheaper overall devices. Additionally, because the exterior connectors 405 may be placed in any configuration, the restrictions usually realized on the size of the chip may be relaxed without negative consequences, resulting in even smaller chip sizes.

Figure 6B:
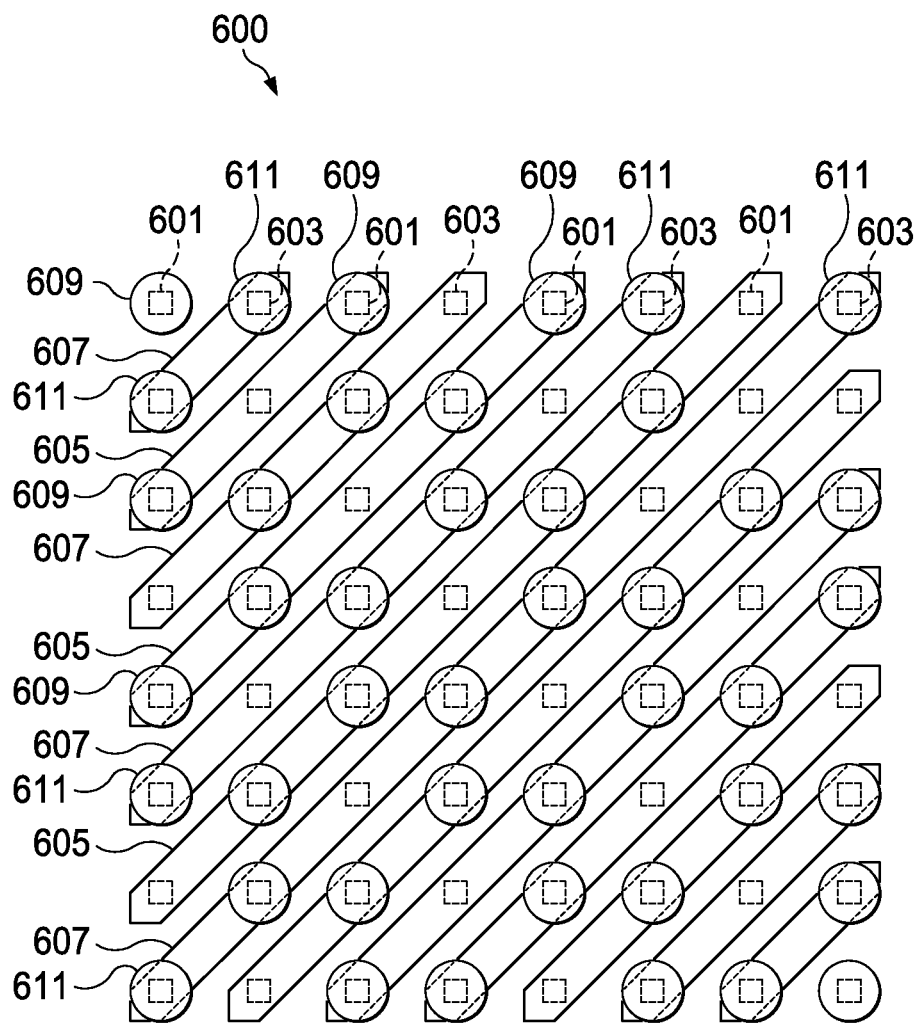

FIGS. 6a-6b illustrate a zoomed cross-sectional view and a plan view, respectively, of the second side 107 of the substrate 101 in another embodiment of the present invention that contains a power matrix 600. The power matrix 600 is formed on the second side 107 of the substrate 101 in connection with multiple P/G TSVs 303 in order to supply power directly to the active devices 102 through the substrate 101. As such, because the power matrix 600 is formed along the second side 107 of the substrate 101, one or more signal contact pads 613 may be formed in the top layer of the metallization layers 201 to connect to exterior devices through the passivation layer 203. In this fashion, the power/ground and signal connections may be separated from each other, with the power/ground connections routed through the substrate 101 by the P/G TSVs 303 and the signal connections being routed through the metallization layers 201 and the passivation layer 203.

In this embodiment, the P/G TSVs 303, the redistribution lines 401, and the exterior connectors 405 may be subdivided into power TSVs 601 and ground TSVs 603, power redistribution lines 605 and ground redistribution lines 607, and power exterior connectors 609 and ground exterior connectors 611, respectively. In this embodiment, the power TSVs 601 and the ground TSVs 603 are arranged in a matrix that includes rows and columns, with each row and column having an alternating series of power TSVs 601 and ground TSVs 603. Additionally, the power redistribution lines 605 and the ground redistribution lines 607 are located as straight lines laid out in an alternating pattern, such that a power redistribution line 605 is not located next to another power redistribution line 605, but, rather, is located next to one or more ground redistribution liens 607. In this fashion, one power redistribution line 605 may connect together power TSVs 601 from each row, while one ground redistribution line 607 may connect together ground TSVs 603 from each row.

In this embodiment, multiple power exterior connectors 609 are formed along each power redistribution line 605, and each power exterior connector 609 is located over a power TSV 601. Along each power redistribution line 605, each power TSV 601 that is overlied by a power exterior connector 609 is adjacent to only one other power TSV 601 that is also overlied by another power exterior connector 609. As such, each power redistribution line 605 has a repeating pattern of two power TSVs 601 that are overlied by power exterior connectors 609 followed by a power TSV 601 that is not overlied by a power exterior connector 609.

Similarly, each ground exterior connector 611 is located over a ground TSV 603. Along each ground redistribution line 607, each ground TSV 603 that is overlied by a ground exterior connector 611 is adjacent to only one other ground TSV 603 that is also overlied by another ground exterior connector 611. As such, each ground redistribution line 607 also has a repeating pattern of two ground TSVs 603 that are overlied by ground exterior connectors 611 followed by a ground TSV 603 that is not overlied by a ground exterior connector 611.

However, as one of skill in the art will recognize, the array layout as described above with respect to FIG. 6 is merely one illustrative embodiment of a layout architecture that may be utilized to supply power and ground connections to the active devices 102. Any suitable layout of power TSVs 601 and ground TSVs 603, power redistribution lines 605 and ground redistribution lines 607, and power exterior connectors 609 and ground exterior connectors 611 for a power matrix 600 that may be utilized to provide power to the semiconductor die may alternatively be used. Any and all such layouts are fully intended to be included within the scope of the present invention.

Such a power matrix 600 located on the second side 107 of the substrate 101 may be up to ten times smaller than the conventional power mesh with an equivalent resistance. As such, this power matrix 600 may replace the conventional power mesh that is typically found in the uppermost metallization layers of a conventional semiconductor die, allowing for the removal of the conventional power mesh and an overall reduction in the number of required metallization layers. Further, with no intermediate power routing, the overall number of exterior connections 405 (e.g., power pads) may be significantly reduced from the conventional power mesh, allowing for signal routing to occur in areas previously taken up by power routing, and further reducing the number of metallization layers required over the first side 105 of the substrate 101. The P/G TSVs 303 may also act as decoupling capacitors which minimize noise from the power supply. All of this may be used to reduce the overall size of the dies in both areas as well as metallization layers, allowing for a greater number of dies per wafer to be formed, reducing costs and increasing yield while simultaneously reducing the number of power and ground pins to about 300 from a typical 1000.

Figure 6C:
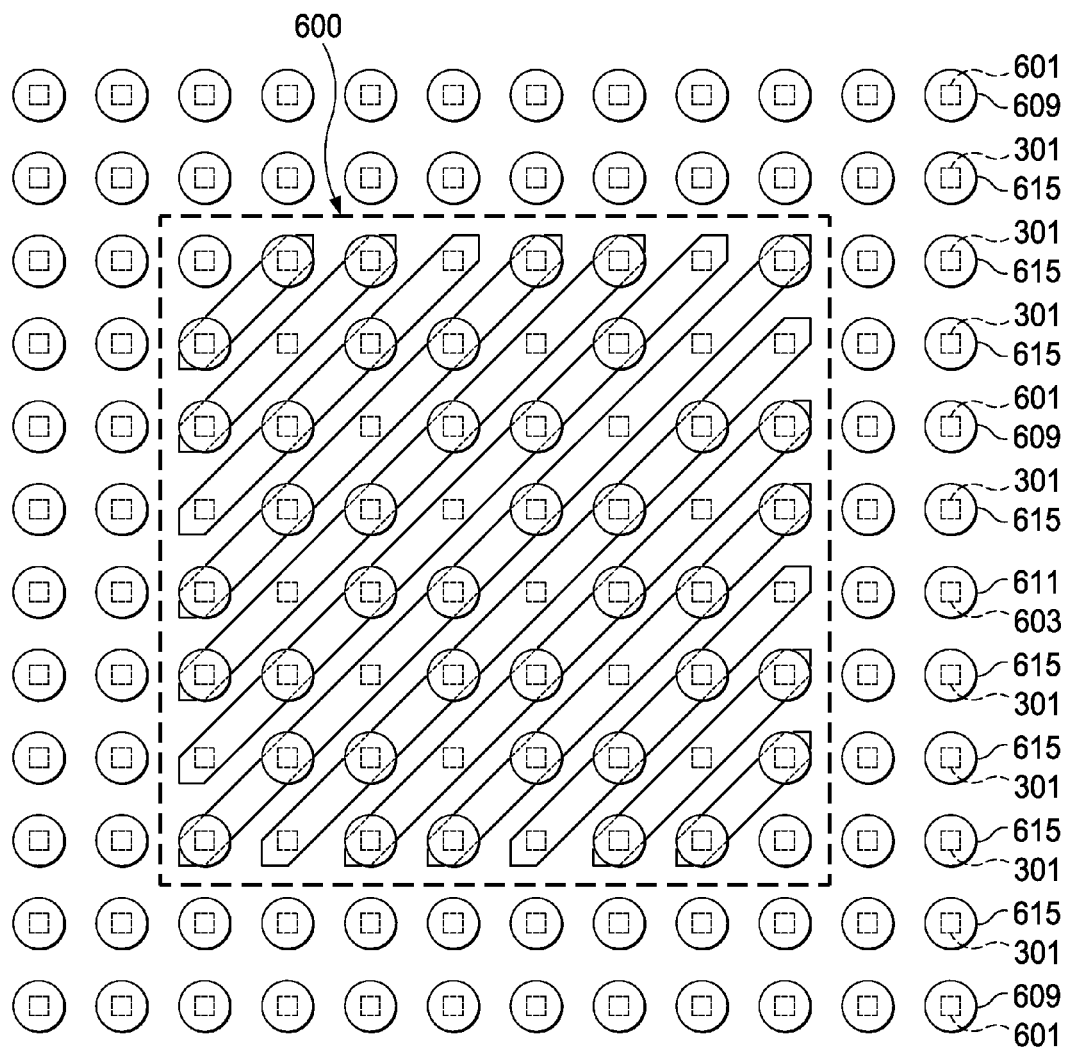

FIG. 6c illustrates another embodiment in which the power matrix 600, instead of being the only connections along the second side 107 of the substrate 101, is surrounded by one or more rows of power exterior connectors 609, ground exterior connectors 611, and signal exterior connectors 615. While the power exterior connectors 609 and ground exterior connectors 611 are electrically connected to power TSVs 601 and ground TSVs 603, respectively, the signal exterior connectors 615 are connected to signal TSVs 301 in order to route signals from the second side 107 of the substrate 101 to the active devices 102. However, in this embodiment, while there may be a mixture of power exterior connectors 609, ground exterior connectors 611, and signal exterior connectors 615 in the periphery, there are no signal exterior connectors 611 located within the power matrix 600.

Figure 6D:
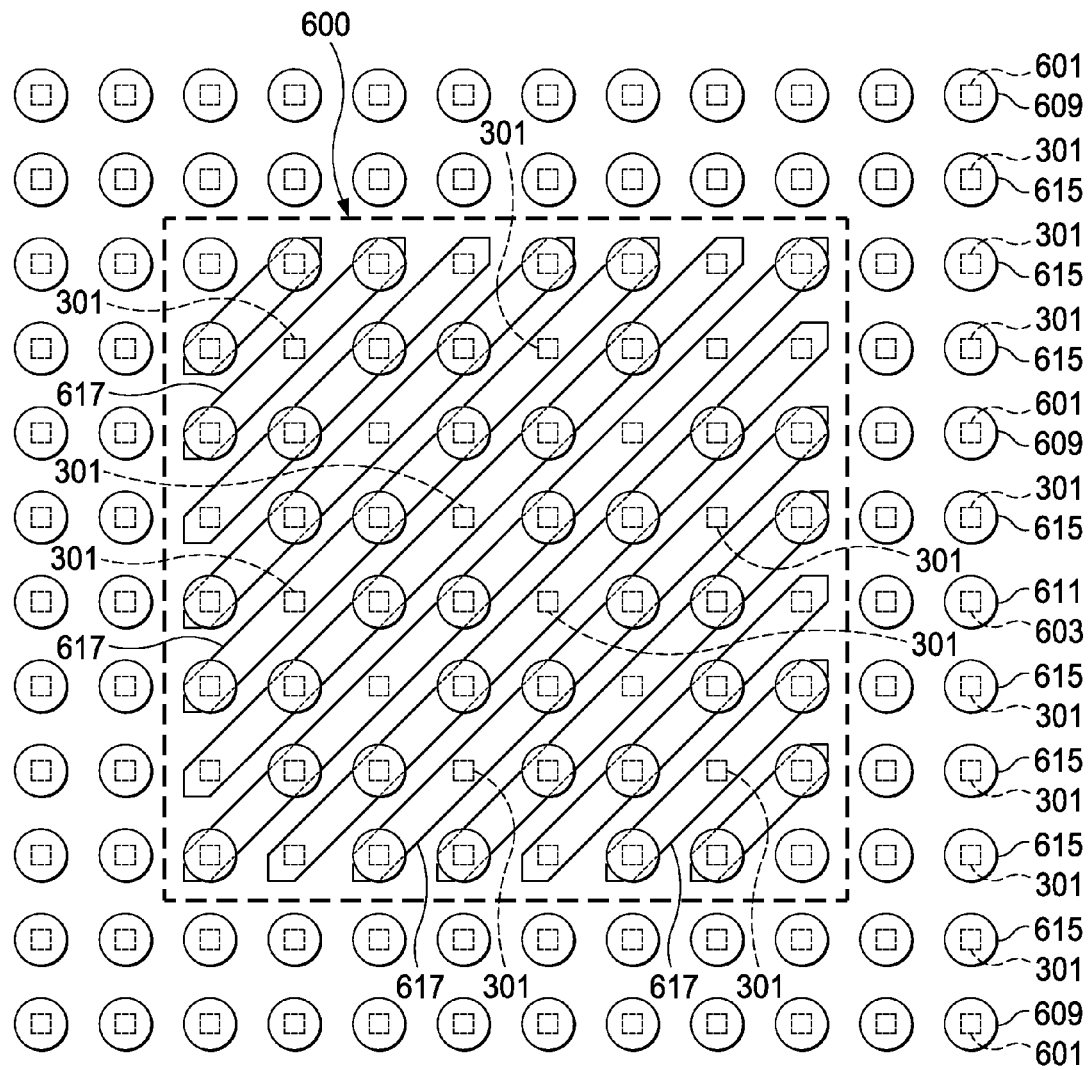

FIG. 6d illustrates yet another embodiment which, while similar to the embodiment disclosed above with respect to FIG. 6c, also incorporates signal TSVs 301 into the power matrix 600. In this embodiment, the power matrix 600 is again located in a central, non-periphery portion of the second side 107 of the substrate, and is surrounded by one or more rows (two rows in this illustrated embodiment) of a combination of power TSVs 601, ground TSVs 603, and signal TSVs 301, along with their associated power exterior connectors 609, ground exterior connectors 611, and signal exterior connectors 615, respectively. However, in this embodiment, one or more signal TSVs 301 are located within the actual power matrix 600 itself, thereby expanding options for routing signals to the active devices 102. Signals may be routed to the one or more signal TSVs 301 through signal redistribution lines 617.

Figure 7:
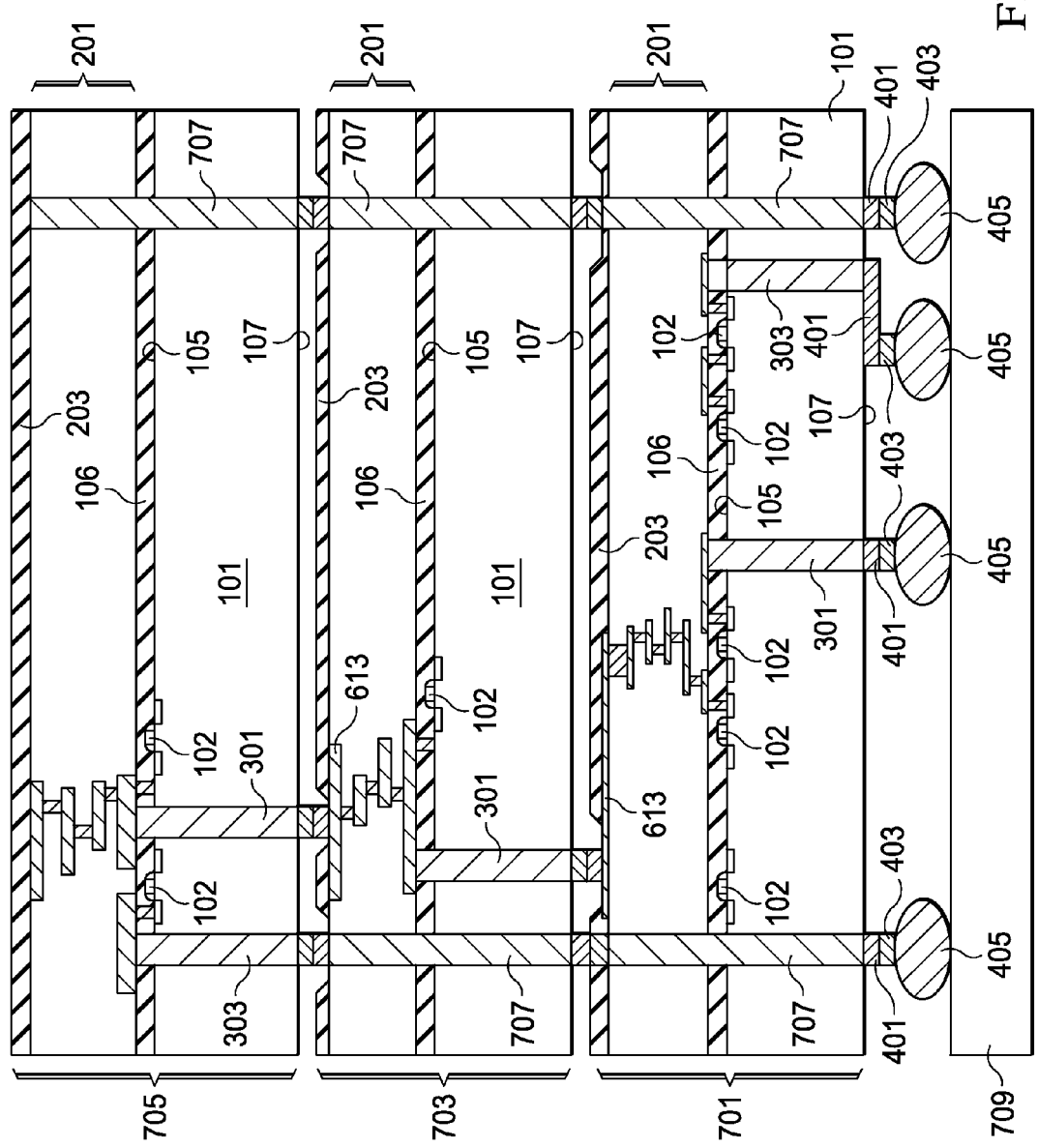
FIG. 7 illustrates a system in package embodiment in accordance with an embodiment of the present invention.

FIG. 7 illustrates an embodiment of the present invention which incorporates the use of the layout architectures described above with respect to FIGS. 5a-5b and the power matrix described above with respect to FIGS. 6a-6d into a system in package architecture instead of a system on chip architecture. In this embodiment, the structures and layouts as illustrated above may be incorporated into multiple semiconductor dies, such as a first semiconductor die 701, a second semiconductor die 703, and a third semiconductor die 705, in a system-in-package (SiP) configuration. The first semiconductor die 701, the second semiconductor die 703, and the third semiconductor die 705 may then be bonded to a packaging substrate 709 (e.g., a printed circuit board) and to each other such that the TSVs of one semiconductor die (e.g., signal TSV 301 in the second semiconductor die 703) are in electrical contact with either signal contact pads 613 or else via-last TSVs 707 of an adjacent semiconductor die (e.g., the first semiconductor die 701).

The via-last TSVs 707 may be made in a similar fashion as the signal TSVs 301 and P/G TSVs 303 described above with respect to FIGS. 1-3. However, instead of a via-first process such as the one described above to form the signal TSVs 301 and the P/G TSVs 303, the removal and filling of the via-last TSVs 707 is done after the formation of the passivation layer 203, such that the via-last TSV 707, when completed, extends through the semiconductor die in which it is made (e.g., the first semiconductor die 701). As such, a combination of via-first (e.g., signal TSVs 301 and P/G TSVs 303) and via-last TSVs (e.g., via-last TSV 707) may be formed. Additionally, while the signal TSVs 301 and the P/G TSVs 303 are used to route power and signals to the active devices 102 located within the die on which the signal TSVs 301 and the P/G TSVs 303 are formed, the via-last TSVs 707 are used to route signals and power through the die in which the via-last TSVs 707 are located (e.g., the first semiconductor die 701) to another die (e.g., the second semiconductor die 703).

With the combination of signal TSVs 301, P/G TSVs 303, and via-last TSVs 707, any number of connections may be made from the second side 107 of the substrate 101 of the first semiconductor die 701 to the second side 107 of the substrate 101 of the second semiconductor die 703. For example, a power matrix 600 located on the second side 107 of the substrate of the first semiconductor die 701 may supply power to the active devices 102 of the first semiconductor die 701 while also using via-last TSVs 707 to supply power to another power matrix 600 located on the second side 107 of the substrate 101 of the second semiconductor die 703.

Further, as one of ordinary skill in the art will recognize, the above described combination of power matrices 600 joined through via-last TSVs 707 is merely one illustrative embodiment of the present invention. Any suitable combination of the layouts and architectures described above with respect to FIGS. 5a-6d may be utilized to form multiple connections to supply signals, power, and ground connections to the first semiconductor die 701, the second semiconductor die 703, and the third semiconductor die 705. All of these potential combinations are fully intended to be included within the scope of the present invention.

Although the present invention and its advantages have been described in detail, it should be understood that various changes, substitutions and alterations can be made herein without departing from the spirit and scope of the invention as defined by the appended claims. For example, any number of methods used to form the TSVs may alternatively be utilized.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
    a substrate with a first side and a second side opposite the first side, the substrate on the second side having a peripheral region and an interior region surrounded by the peripheral region;
    a plurality of devices located on the first side of the substrate, the plurality of devices being at least part of the substrate;
    a first set of conductive vias extending entirely through the substrate, the one or more conductive vias being located in the peripheral region; and
    a second set of conductive vias extending entirely through the substrate, the one or more conductive vias being located in the interior region, wherein the second set of conductive vias are part of a power matrix.

2. The semiconductor device of claim 1, wherein the second set of conductive vias are located in a line that separates the second side of the substrate into a first section and a second section.

3. The semiconductor device of claim 2, further comprising a third set of conductive vias, the third set of conductive vias located in a line that separates the second section of the substrate into a third section and a fourth section.

4. The semiconductor device of claim 1, further comprising redistribution lines located on the second side of the substrate, the redistribution lines electrically connected to the second set of conductive vias.

5. The semiconductor device of claim 1, further comprising:
    metallization layers over the first side of the substrate; and
    a continuous passivation layer over the metallization layers.

6. The semiconductor device of claim 1, wherein the first set of conductive vias and second set of conductive vias are all either power connections or ground connections.

7. The semiconductor device of claim 1, wherein the second set of conductive vias are arranged into at least a first line and a second line, wherein the first line is parallel to a first side of the substrate and the second line is perpendicular to and separated from the first line.

8. A semiconductor device comprising:
    a substrate with a first side and a second side;
    devices and a metallization region located on the first side of the substrate, the metallization region being located further from the substrate than the devices, wherein at least a portion of the substrate is part of the devices;
    conductive vias extending completely through the substrate to make physical contact with the metallization region and to make electrical contact to the devices through the metallization layer; and
    a power matrix located on the second side of the substrate.

9. The semiconductor device of claim 8, further comprising conductive vias that extend through the substrate and electrically connect the devices region to the power matrix.

10. The semiconductor device of claim 9, wherein the conductive vias are arranged in an array of rows and columns.

11. The semiconductor device of claim 9, wherein the power matrix further comprises:
    a redistribution layer electrically connected to the conductive vias; and
    exterior connections electrically connected to the redistribution layer.

12. The semiconductor device of claim 11, wherein the redistribution layer comprises power redistribution lines and ground redistribution lines arranged in alternating rows.

13. The semiconductor device of claim 11, wherein each exterior connection is located over individual ones of the conductive vias.

14. The semiconductor device of claim 13, wherein each exterior connection is located over a conductive via that is adjacent to no more than one other conductive via located under another exterior connection.

15. The semiconductor device of claim 8, wherein the metallization region comprises a plurality of metallization layers, and the uppermost metallization layer is a signal contact pad.

16. A method of manufacturing a semiconductor device, the method comprising:
   providing a substrate with a first side and a second side, wherein the first side is planar;
   forming devices and a metallization region over the first side of the substrate, wherein the forming devices further comprises forming at least a portion of the devices within the substrate;
   forming a power matrix over the second side of the substrate and
   forming conductive vias to connect the power matrix to the devices and metallization region, each of the conductive vias extending totally through the substrate.

17. The method of claim 16, further comprising:
   forming a redistribution layer in electrical contact with the conductive vias; and
   forming exterior connections in electrical contact with the redistribution layer.

18. The method of claim 17, wherein the forming the redistribution layer further comprising forming power redistribution lines and ground redistribution lines in alternating rows.

19. The method of claim 17, wherein the forming exterior connections is performed such that each exterior connection is located over a conductive via that is adjacent to no more than one other conductive via located under another exterior connection.

* * * * *